(12) United States Patent
Tripathi et al.

(10) Patent No.: US 7,027,501 B1
(45) Date of Patent: Apr. 11, 2006

(54) METHODS AND APPARATUS FOR ADAPTIVE EQUALIZATION

(75) Inventors: Adya S. Tripathi, San Jose, CA (US);
Delon Hanson, Los Altos, CA (US);
Kar Shing Chiu, Sunnyvale, CA (US);
Ming-Tak Leung, Palo Alto, CA (US);
Raman Dakshinamurthy, San Jose, CA (US); Ki Chun Fu, San Jose, CA (US)

(73) Assignee: Tripath Technology Inc., Santa Clara, CA (US)

( * ) Notice: Subject to any disclaimer, the term of this patent is extended or adjusted under 35 U.S.C. 154(b) by 689 days.

(21) Appl. No.: 10/084,580

(22) Filed: Feb. 27, 2002

Related U.S. Application Data

(60) Provisional application No. 60/272,399, filed on Feb. 28, 2001.

(51) Int. Cl.
*H03H 7/30* (2006.01)
*H03H 7/40* (2006.01)
*H03K 5/159* (2006.01)

(52) U.S. Cl. ..................................... 375/232; 375/229
(58) Field of Classification Search ............... 375/229, 375/232, 234
See application file for complete search history.

(56) References Cited

U.S. PATENT DOCUMENTS

| | | | | |
|---|---|---|---|---|
| 5,428,605 | A | * | 6/1995 | Andre .................. 370/290 |
| 6,289,046 | B1 | * | 9/2001 | Takeuchi et al. ........... 375/232 |
| 6,438,162 | B1 | * | 8/2002 | Boyd et al. ................ 375/232 |

OTHER PUBLICATIONS

John G. Proakis, Masoud Salehi, "*Communication Systems Engineering*", p. 577-595 ISBN 0-13-158932-6, © 1994 by Prentice-Hall, Inc.

* cited by examiner

*Primary Examiner*—Kevin Burd
*Assistant Examiner*—Freshteh N Aghdam
(74) *Attorney, Agent, or Firm*—Beyer Weaver & Thomas, LLP

(57) ABSTRACT

According to the present invention, methods and apparatus are provided for improving the signal quality of received transmission. An adaptive equalizer includes multiple output delay lines. One output delay line is configured to provide gradient elements. Another output delay line is configured with coefficient multipliers calculated using the gradient elements. The coefficient multipliers are used to alter a received signal to more closely correspond to an expected signal. The adaptive equalizer can be used in systems such as optical transceivers.

20 Claims, 6 Drawing Sheets

Figure 6

| Types Of Transceiver | Optical Transmitter ||||| Optical Receiver ||||
|---|---|---|---|---|---|---|---|---|
| | Interface/ Retimer/ Serialize | LD Driver | LDs | Optical Mux | Detect + TIA | Post Amp | Adaptive Equalize/ Deserialize | Interface/ Retimer |
| WWDM, Non-Equalized (601) | XAUI/Yes/No | 4 @ 3.125 GBd | 4 @ 3.125 GBd | Yes | 4 @ 3.125 GBd | 4 @ 3.125 GBd | No/No | XAUI/Yes |
| Serial Standard, Non-Equalized (603) | XAUI or XSBI/No/Yes | 10 GHz | 10 GHz | No | 10 GHz | 10 GHz | No/Yes | XAUI or XSBI/No |
| Tripath, Standard Serial Tx Optics (605) | XAUI or XSBI/No/Yes | 10 GHz | 10 GHz | No | 2.5 GHz | 2.5 GHz | Yes/Yes | XAUI or XSBI/No |
| Tripath With 1/4 Rate Tx & Rx Optics (607) | XAUI or XSBI/No/Yes | 2.5 GHz | 2.5 GHz | No | 2.5 GHz | 2.5 GHz | Yes/Yes | XAUI or XSBI/No |

METHODS AND APPARATUS FOR ADAPTIVE EQUALIZATION

CROSS REFERENCE TO RELATED APPLICATIONS

The present application claims priority from U.S. Provisional Patent Application No. 60/272,399 for METHODS AND APPARATUS FOR ADAPTIVE EQUALIZATION filed on Feb. 28, 2001, the entirety of which is incorporated herein by reference for all purposes.

BACKGROUND OF THE INVENTION

1. Field of the Invention

The present application generally relates to adaptive equalization. More specifically, the present application provides methods and apparatus for implementing adaptive equalization in systems such as fiber optic receivers.

2. Description of Related Art

The efficacy of communication systems sending signals over various media is often limited by factors affecting signal quality. Limiting factors include noise, intersymbol interference (ISI), distortion, delay, etc. These factors often limit the line rate and bandwidth of various media. Communication system receivers have been designed with various mechanisms for alleviating the effects of noise, ISI, distortion, delay, etc. One mechanism used to alleviate these limiting factors in some communication systems is adaptive equalization. However, it has proven difficult to implement adaptive equalization in particular systems such as optical transmission systems because of the particular requirements of optical transceiver systems.

Consequently, it is desirable to provide improved techniques for implementing adaptive equalization that can be applied not only in fibre optic communication systems, but signal processing systems generally.

SUMMARY OF THE INVENTION

According to the present invention, methods and apparatus are provided for improving the signal quality of received transmission. An adaptive equalizer includes multiple output delay lines. One output delay line is configured to provide gradient elements. Another output delay line is configured with coefficient multipliers calculated using the gradient elements. The coefficient multipliers are used to alter a received signal to more closely correspond to an expected signal. The adaptive equalizer can be used in systems such as optical transceivers.

According to various embodiments, an adaptive equalizer is provided. The adaptive equalizer includes an input delay line, a first output delay line, and a second output delay line. The input delay line includes delay elements and is configured to receive an input signal and provide intermediate signals. The intermediate signals are shifted representations of the input signal. The first output delay line includes delay elements. The first output delay line is configured to receive intermediate signals and provide gradient elements for computing coefficient multipliers. A second output delay line is configured to receive intermediate signals and use coefficient multipliers to combine the intermediate signals into an equalized output signal.

According to other embodiments, a filter is provided. The filter includes an input delay line, a first output delay line, and a second output delay line. The input delay line includes delay elements and is configured to receive an input signal and provide intermediate signals. The intermediate signals are shifted representations of the input signal. The first output delay line includes delay elements and switches configured to receive intermediate signals. The first output delay line is operable to provide gradient elements for computing coefficient multipliers. A first gradient element is provided for computing a first coefficient multiplier when a first switch associated with the first gradient element is selected. The second output delay line includes delay elements and coefficient multipliers. The coefficient multipliers are configured to receive intermediate signals, wherein the plurality of coefficient multipliers are operable to alter the intermediate signals using the plurality of coefficient multipliers calculated using the gradient elements provided by the first output delay line.

According to still other embodiments, an optical switch is provided. The optical switch includes an optical receiver and adaptive equalization circuitry coupled to the optical receiver. The adaptive equalization circuitry includes an input delay line, a first output delay line, and a second output delay line. The input delay line includes delay elements and is configured to receive an input signal and provide intermediate signals. The intermediate signals are shifted representations of the input signal. The first output delay line includes delay elements and switches configured to receive intermediate signals. The first output delay line is operable to provide gradient elements for computing coefficient multipliers. A first gradient element is provided for computing a first coefficient multiplier when a first switch associated with the first gradient element is selected. The second output delay line includes delay elements and coefficient multipliers. The coefficient multipliers are configured to receive intermediate signals, wherein the plurality of coefficient multipliers are operable to alter the intermediate signals using the plurality of coefficient multipliers calculated using the gradient elements provided by the first output delay line.

A further understanding of the nature and advantages of the present invention may be realized by reference to the remaining portions of the specification and the drawings.

BRIEF DESCRIPTION OF THE DRAWINGS

The invention may best be understood by reference to the following description taken in conjunction with the accompanying drawings, which are illustrative of specific embodiments of the present invention.

FIG. 6 shows a listing of various 10 GB per second transponder component interfaces that can be used in optical systems.

DETAILED DESCRIPTION OF SPECIFIC EMBODIMENTS

Reference will now be made in detail to some specific embodiments of the invention including the best modes contemplated by the inventors for carrying out the invention.

Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. Any signal processing system where signal integrity can be improved can use the techniques of the present invention. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Figure 1:
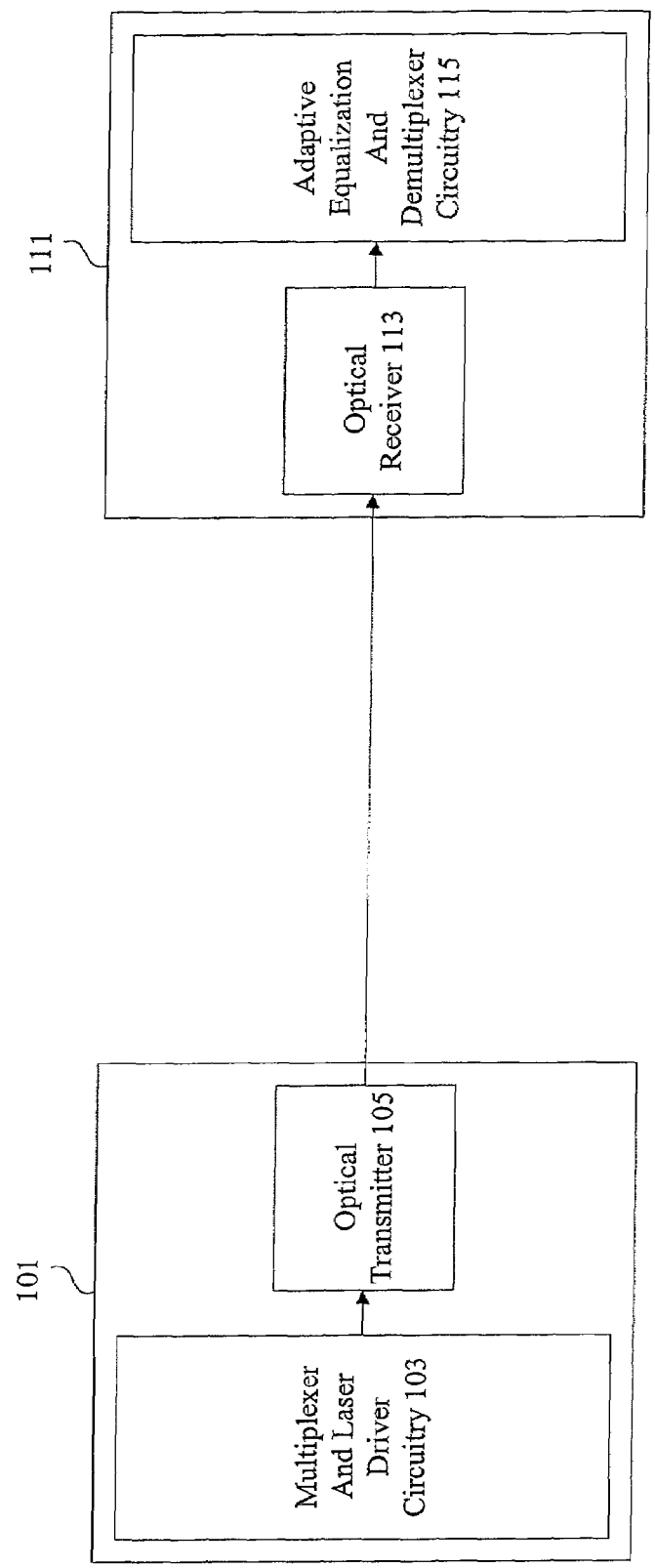
FIG. 1 is a diagrammatic representation of a system that can use the techniques of the present invention.

FIG. 1 is a diagrammatic representation showing one example of a system that can use the techniques of the present invention. In one embodiment, an optical switch 101 includes multiplexer and laser driver circuitry 103 and optical transmitter 105. Optical switch 101 is connected to optical switch 111 through one or more fiber links. The fiber links are operable to carry one or more modes as well as one or more channels per mode. In one example, optical transmitter 105 transmits at a frequency of 1310 nm at 10 GB per second for link links of approximately 10 kilometers. For link lenghts extending beyond 40 kilometers, 1550 nm lasers can be used. It should be noted that optimal frequencies for transmission vary depending upon factors such as link length and transmission medium.

Optical switch 111 includes an optical receiver 113 and adaptive equalization and demultiplexer circuitry 115. Because of factors such as noise, ISI, differential mode delay (DMD), polarization mode dispersion (PMD), and distortion, the signal received at optical receiver 113 may be significantly different from the signal transmitted by an optical transmitter 105. In one example, defects in a fiber index profile can result in multiple pulses being received from a single launch pulse. Pulse broadening in multiple pulses also results from polarization, mode dispersion. According to various embodiments, the dispersion results from imperfect refractive indices of various fiber links. The different fiber indices of refraction lead to different propagation rates. According to various embodiments, the optical switch includes adaptive equalization and demultiplexer circuitry 115. The demultiplexer circuitry extracts the individual signals received at optical receiver 113 and the adaptive equalizer alters the signal to more closely resemble the signal transmitted by optical switch 101.

According to various embodiments, the adaptive equalization circuitry 115 compares a signal received by optical receiver 113 to an expected signal. The expected signal corresponds to the signal transmitted by optical transmitter 105. In one embodiment, the optical switch 101 periodically transmits this expected signal to optical switch 111. In another embodiment, optical switch 101 transmits the expected signal to optical switch 111 whenever requested by the optical switch 111. Optical switch 111 computes coefficient multipliers for altering the received signal in order to derive the expected signal from the signal received by optical receiver 113. The coefficient multipliers can be computed once, periodically, or continuously. Values or components used to alter shifted representations of an input signal to derive an output signal most closely resembling an expected signal are referred to herein as coefficient multipliers.

In one example of a system having multiple channels for a particular fiber links, thermoelectric coolers are used to stabilize laser wavelengths for dense wavelength multiplexing systems. A variety of techniques can be used to combine multiple signals into one signal transmitted over one or more frequencies. The thermoelectric coolers are also used to control tracking between laser and absorptive modulator transmission wave links to increase signal output power. According to various embodiments, coarse wavelength division multiplexing is used to reduce the difficulty of directly modulating a laser at high speeds and to reduce the cost of dense wavelength division multiplexing (DWDM) components. In one example, four lasers operating at a quarter of the line rate transmit simultaneously onto a single fiber link at frequencies separated by 25 nm to achieve full line rate transmission.

In one particular example, four lasers operating at 2.488 GB per second as specified by Sonet OC-48 are able to achieve an aggregate transmission rate of 9.952 GB per second as specified by OC-192. Conventional receivers use full line rate detectors and preamplifiers as well as full line rate transmitters. According to various embodiments, an adaptive equalizer is used with the four quarter rate sets of optical detectors and preamplifiers. By applying adaptive equalization, lower cost components can be used to achieve the performance of higher cost components. According to various embodiments, it is contemplated that optical receivers implementing CMOS technology will be able to operate at 10 GB per second using adaptive equalization.

As will be appreciated by one of skill in the art, the techniques and mechanisms for adaptive equalization can be applied in a variety of signal processing systems other than optical transceiver systems. In one example, adaptive equalization can be applied in radio frequency transmission systems. The techniques of the present invention can be applied in any system where transmitted signals lose integrity because of factors such as noise, ISI, distortion, and delay.

Figure 2:
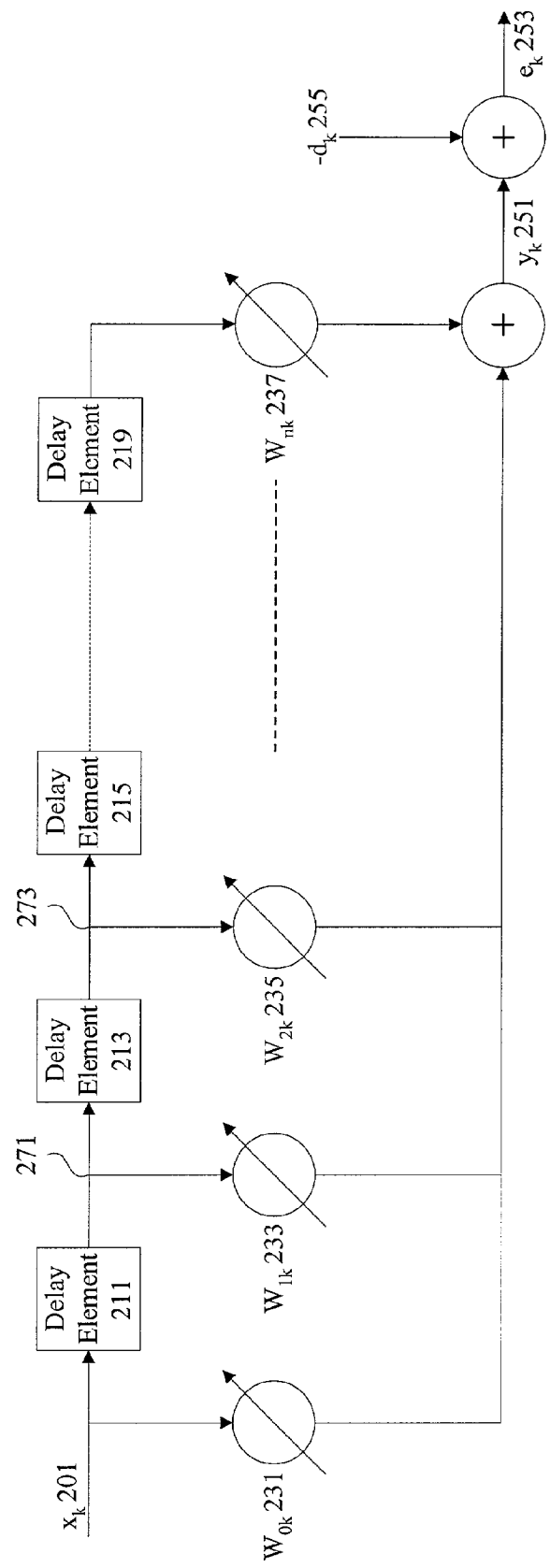
FIG. 2 is a diagrammatic representation showing components for implementing adaptive equalization in typical systems.

FIG. 2 is a diagrammatic representation showing components for implementing adaptive equalization in typical systems. The components effectively act as a finite impulse response (FIR) filter with an input $x_k$ 201, an output $y_k$ 251, an ideal output $d_k$ 255, and an error signal $e_k$ 253 derived by subtracting the output $y_k$ 251 from the ideal output $d_k$ 255. The finite impulse response filter includes multiple delay elements 211, 213, 215, and 219 for providing shifted representations of the input signal $x_k$ 201. It should be noted that any type of shifting of the input signal including time and phase shifting is collectively referred to herein as shifting the input signal. Each representation of the input signal $x_k$ 201 is multiplied by an associated coefficient multiplier $W_{0k}$ 231, $W_{1k}$ 233, $W_{2k}$ 235, and $W_{nk}$ 237. The products of the shifted representations of the input signal multiplied by the coefficient multipliers is summed to yield the output signal $y_k$ 251. According to various embodiments, the coefficient multipliers are initially all set to 1.

The Least Mean Square (LMS) algorithm is one of the most popular methods used in adaptive signal processing for calculating the coefficient multipliers. It is based on the steepest descent method for moving on a performance surface. The LMS algorithm as well as conventional adaptive equalization generally is described in Communication Systems Engineering, John G. Porakis and Masoud Salehi (ISBN: 0131589326), the entirety of which is incorporated by reference for all purposes. One example of coefficient multipliers are tap weights as used in conventional adaptive equalization.

According to typical implementations of the LMS algorithm, the error $e_k$ 253 is expressed as the following:

$$e_k = d_k - X_k^T W_k \quad \text{(Equation 1)}$$

where $X_k$ is an n-sample-long vector of input samples.

Samples of the input signal used to determine coefficient multipliers are referred to herein as gradient elements. A set of gradient elements derived from an input signal is referred to herein as a gradient vector. In one example, $X_k$ is a gradient vector including all gradient elements $x_{ki}$. According to various embodiments, gradient elements are samples of shifted versions of the input signal. In one example, some gradient elements are measured at location 271 and at location 273.

To facilitate the LMS algorithm, $e_k^2$ is taken as an estimate of the error. The gradient estimate at each iteration takes the form:

$$\Delta_k = \delta e_k^2 / \delta W_k = -2 e_k x_k \quad \text{(Equation 2)}$$

Using this estimate of error, the steepest adaptive algorithm is:

$$W_{k+1} = W_k - \mu \Delta_k = W_k + 2\mu e_k X_k \quad \text{(Equation 3)}$$

With the LMS algorithm, $\mu$ is the gain constant that decides the rate of convergence of W and the stability of adaptation. The LMS algorithm is the most popular adaptive algorithm available. However, there are other variations of the LMS algorithm. One variation is the sign—sign LMS algorithm. The sign—sign LMS algorithm is the simplest form of LMS. Instead of using the multiplication of $e_k$ and $X_k$ to compute the next coefficient $W_{k+1}$, the sign of $e_k$ and the sign of $X_k$ are used. In this case the multiplication is reduced to an exclusive OR logic operation:

$$W_{k+1} = W_k + 2\mu \, \text{Sign}[e_k] \, \text{Sign}[X_k] \quad \text{(Equation 4)}$$

Another variation in the implementation of the LMS algorithm serially updates gradient elements $W_{1k}$ one at a time, instead of the whole vector W simultaneously. This allows update hardware to be shared between different gradient elements. The performance of the algorithm is not degraded due to the slow adaptation rate, $\mu$, in most applications.

Due to the high-speed requirements imposed on optical communication applications, continuous time (CT) analog finite impulse response (AFIR) equalizers are constructed from distributed amplifier topology.

Figure 3:
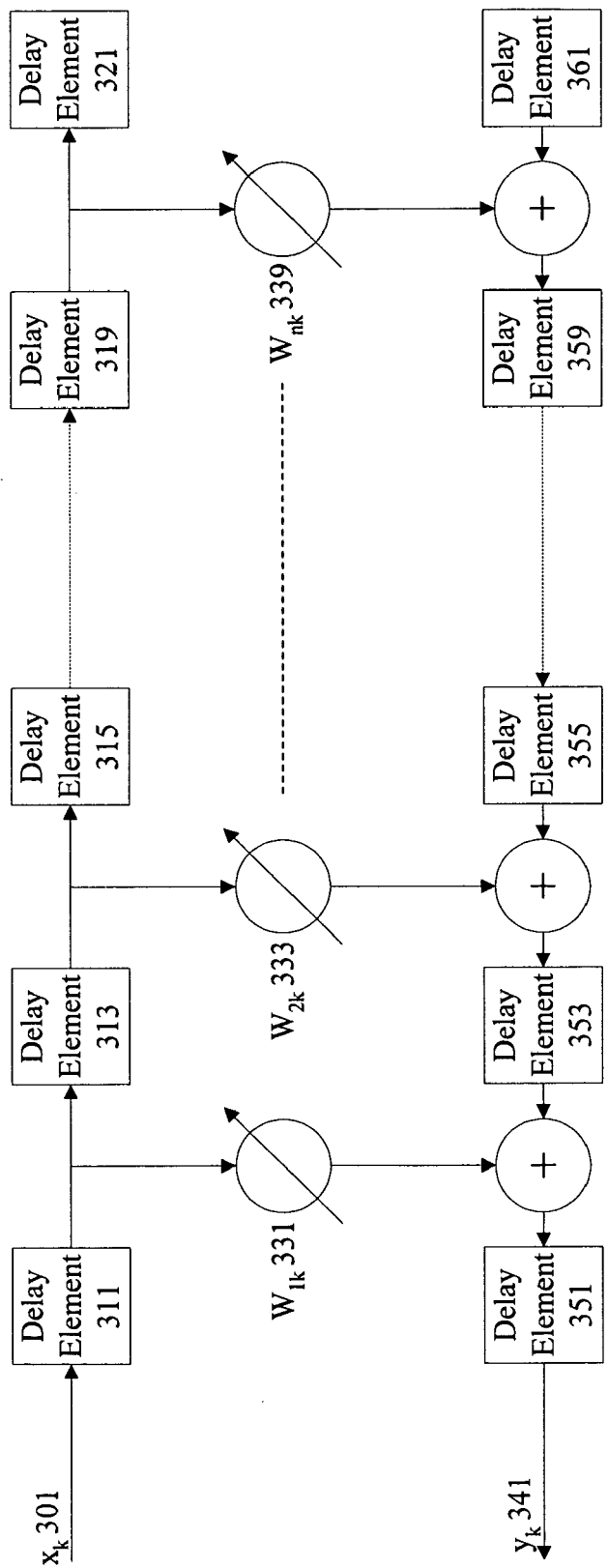
FIG. 3 is a diagrammatic representation of the structure of one example of a distributed amplifier AFIR equalizer.

FIG. 3 is a diagrammatic representation of the structure of one example of a distributed amplifier AFIR equalizer. The adders are symbolic of current summation in the distributed amplifier.

Input signal $x_k$ 301 is passed through delay elements 311, 313, 315, etc. According to various embodiments, the delay elements are implemented as lumped L-C stages or lengths of transmission line. Signals are determined at different phase delay points and added to another delay line at the output side. In general, the delay through each delay elements 311, 313, 315, and 319 will not be identical due to the imbalances of the terminations on each side. Also, the delay of 311, 313, 315, and 319 versus the delay of 351, 353, 355, and 359 will not be equal due to different loading conditions. According to various embodiments, the delay elements are deliberately designed to be unequal to avoid instability in the circuit due to signal feedback via the coefficient multipliers 331, 333, and 339.

The output $y_k$ 341 is expressed as the following:

$$y_k x_k^T W_k \quad \text{(Equation 5)}$$

where $x_{k'}$ is the n-sample-long vector of input samples.

The input samples are delayed versions of $x_k$. The delay for the first sample is the sum of delay elements 311 and 351. The delay for the second sample is the sum of delay elements 311, 313, 353, and 351. The delay for the fourth sample is the sum of delay elements 311, 313, 315, 355, 353, and 351. The delay for the $n^{th}$ sample can be calculated in the same manner. According to various embodiments, n samples corresponding to n coefficient multipliers are taken.

The LMS algorithm is now represented as follows:

$$W_{k+1} = W_k - \mu \Delta_k = W_k + 2\mu e_k X_{k'} \quad \text{(Equation 6)}$$

The sign—sign version of the LMS algorithm becomes $$W_{k+1} = W_k + 2\mu \, \text{Sign}[e_k] \, \text{Sign}[X_{k'}] \quad \text{(Equation 7)}$$

In FIG. 2, the gradient elements $X_{ki}$ associated with the gradient vector $x_{k'}$ were readily available by sampling at locations such as locations 271 and 273. However, in the distributed-amplifier-based AFIR equalizer shown in FIG. 3, the gradient elements $x_{ki'}$ associated with the gradient vector $x_{k'}$ are not readily available. Since the LMS algorithm (and almost all techniques for implementing adaptive equalization) require $X_{k'}$ or Sign $[X_{k'}]$ to be available for the computation of coefficient multipliers, the above distributed amplifier AFIR equalizer structure can not be effectively adapted to improve the integrity of transmitted signals.

Because the gradient elements and the gradient vector are not readily available, typical implementations do not adapt coefficient multipliers. Instead, typical implementations pre-calculate or empirically determine coefficient multipliers and pre-program them into the equalization circuitry. The techniques of the present invention, however, allow coefficient multipliers to be dynamically and automatically determined. No coefficient multipliers need to be pre-programmed into the equalizer. In one example, the adaptive equalization circuitry allows continuous monitoring of the signal to adjust coefficient multipliers to compensate for newly introduced ISI, distortion, or delays.

According to various embodiments, a dual return path distributed amplifier equalizer structure is contemplated in order to use algorithms such as the LMS algorithm in a distributed-amplifier-based equalizer topology.

Figure 4:
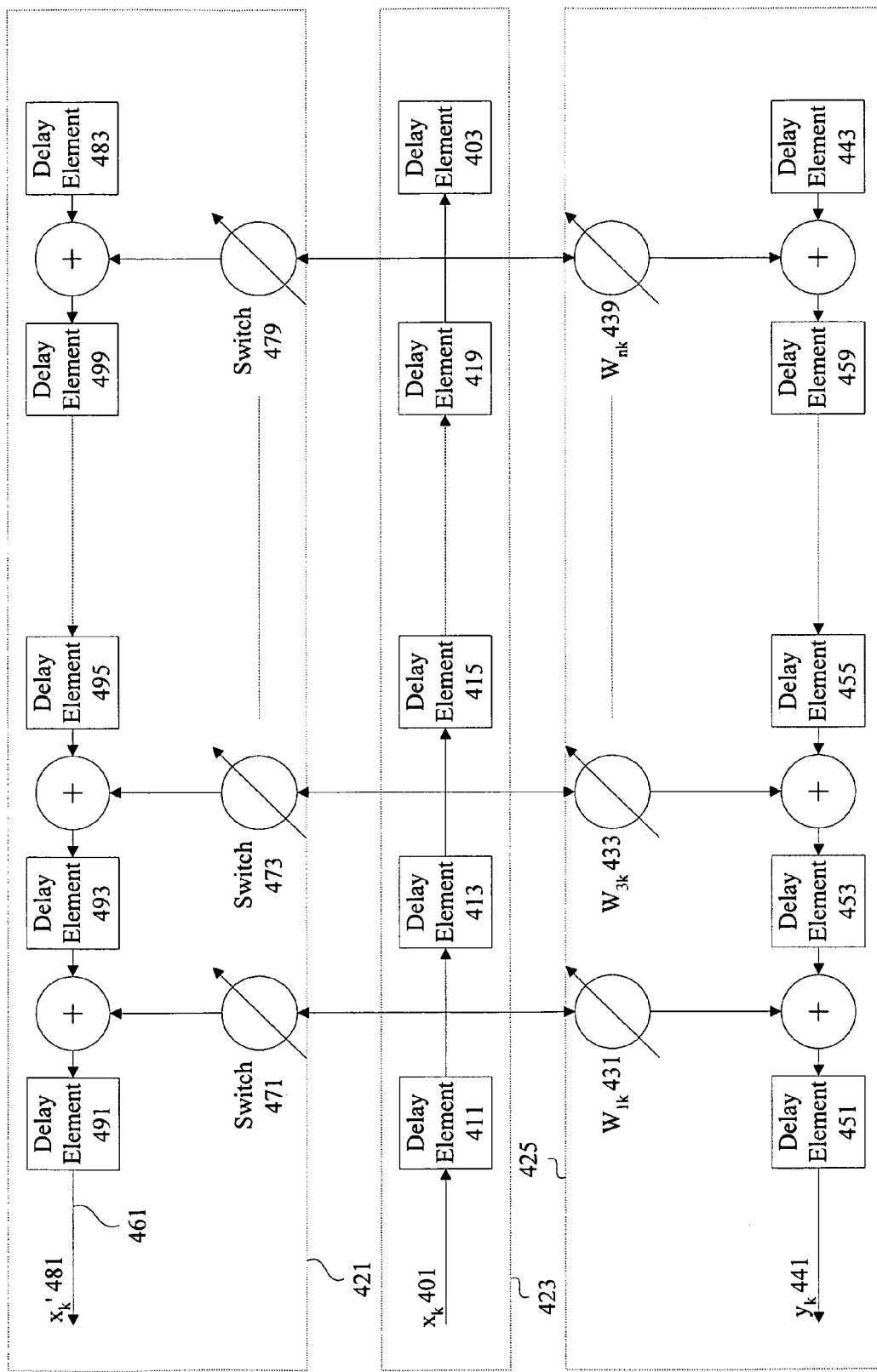
FIG. 4 is a diagrammatic representation of a dual return path architecture for implementing adaptive equalization.

FIG. 4 is a diagrammatic representation of a dual return path architecture for implementing adaptive equalization. An input delay line 423 includes a plurality of delay elements 411, 413, 415, etc. Any line including a plurality of elements for shifting an input signal is referred to herein as an input delay line. The input delay line 423 provides intermediate signals to output delay lines 421 and 425. Any line including a plurality of elements for shifting a signal in order to provide either an output signal or a gradient vector is herein referred to as an output delay line. The output delay line 425 includes coefficient multipliers 431, 433, 439, etc. Intermediate signals are provided from input delay line 423 to the coefficient multipliers of output delay lines 425. The intermediate signals multiplied by the coefficient multipliers are then combined with other intermediate signals multiplied by other coefficient multipliers to yield an output signal $y_k$ 441. According to various embodiments, coefficient multipliers are adjusted until the output signal $y_k$ 441 closely approximates an expected signal.

In order to calculate the coefficient multipliers, Equations 6 and 7 noted above are used. Output delay line 421 is tapped to obtain the gradient elements associated with the gradient vector $X_{k'}$. The output delay line 421 includes multiple delay elements 491, 493, 495, etc., and multiple switches 471, 473, 479, etc. It should be noted that in some embodiments a single switch can be used to implement the functionality of output delay lines 421. The added distributed amplifier output delay line 421 provides a convenient mechanism for measuring gradient elements in gradient vectors. A first shifted signal can be measured by selecting switch 471 to allow an intermediate signal from input delay line 423 to pass to output delay line 421 through switch 471. The other switches in output delay line 421 can be deselected. A first shifted signal 461 is then be measured.

According to various embodiments, the first shifted signal corresponds to a first gradient element associated with a gradient vector. The first gradient element is used to calculate a first coefficient multiplier 431. To measure a second shifted signal, a second switch 473 is selected to allow an intermediate signal from input delay line 423 to travel to output delay line 421 through switch 473. In one example, selecting a switch entails turning the switch on and allowing a signal to pass through the switch. According to various embodiments, all other switches 471, 479, etc. do not allow an intermediate signal to pass. The second shifted signal is then measured at 461 where the signal has traversed delay elements 411, 413, 493, and 491. The second gradient element is used to calculate a second coefficient multiplier.

After determining all the gradient elements, the gradient vector can be entered into a series of equations to determine the coefficient multipliers to be used in output delay line 425. According to various embodiments, the coefficient multipliers are determined, one at a time, as follows:

a first output delay line includes only delay element 491. A second output delay line includes only delay elements 493 and 491. A third output delay line includes only delay elements 495, 493, and 491. A wide variety of output delay lines can be configured to allow measurement of shift input signals.

Figure 5:
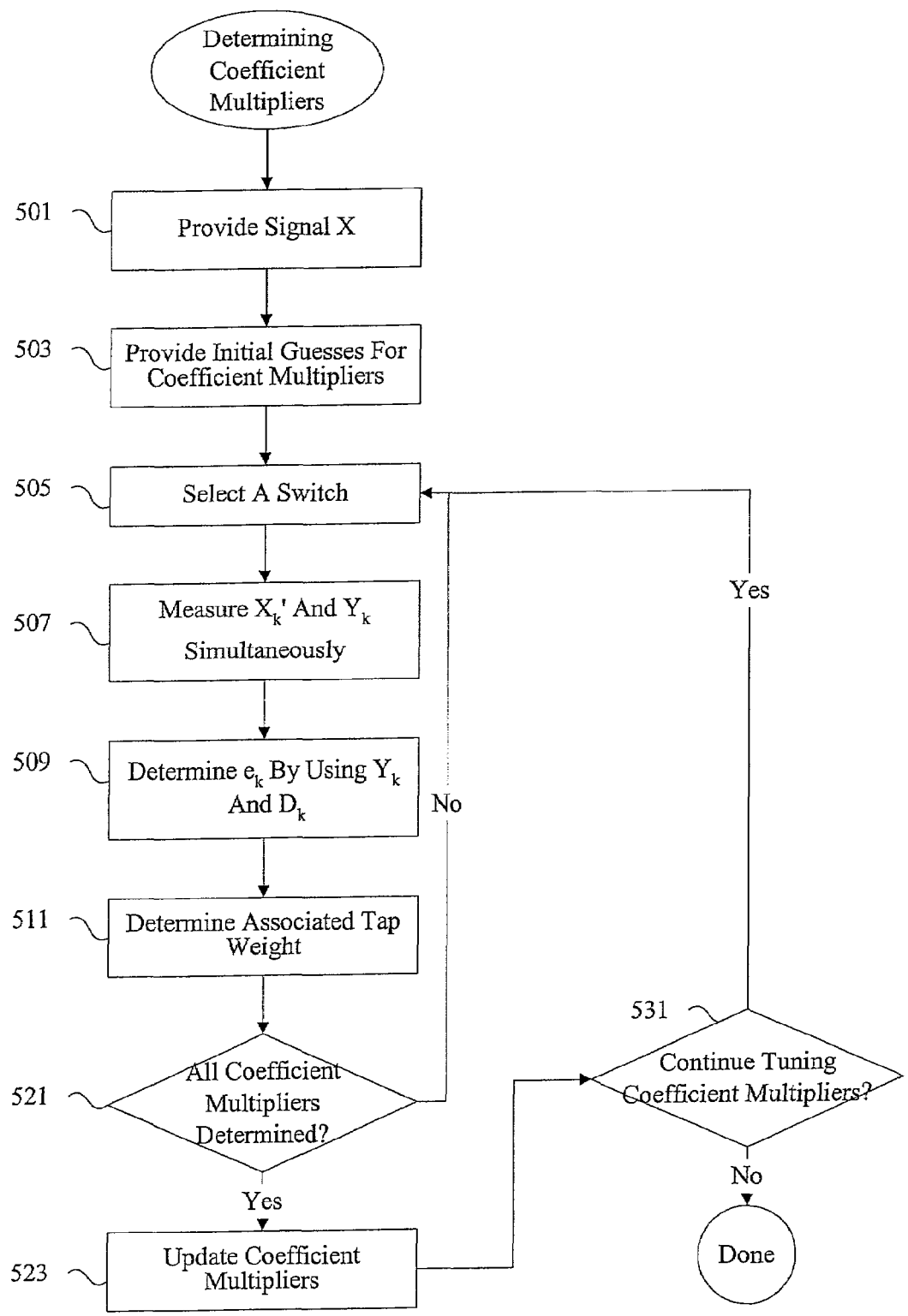
FIG. 5 is a process flow diagram showing one example of a technique for determining coefficient multipliers.

FIG. 5 is a process flow diagram showing one example of a technique for determining coefficient multipliers. At 501, an input signal is provided. According to various embodiments, an expected signal is also provided. At 503, initial guesses for the coefficient multipliers are provided. In one embodiment, the initial guesses for the coefficient multipliers are all set to 1. At 505, a switch is selected. In one embodiment, the switch selected is the first switch associated with a first shifted signal. At 507, the gradient elements and the output signal are measured substantially simultaneously. At 509, the error is determined by subtracting the expected signal from the measured signal. A corresponding coefficient multiplier is then determined at 511. At 521, it is determined whether all of the new coefficient multipliers have been calculated. According to various embodiments, all the coefficient multipliers have been calculated after all of the gradient elements have been determined and entered to Equation Series 8.

It should be noted that the switches can be selected in any particular order. That is, the coefficient multipliers determined using the gradient elements can be calculated in any of a variety of orders. In one example, a second switch is $$W_{0k+1} = W_{0k} + 2\mu e_k x_{0,k'} \quad \text{(with switch 471 selected, } x_{k'} = x_{0k'}\text{)}$$

$$W_{1k+1} = W_{1k} + 2\mu e_k x_{1,k'} \quad \text{(with switch 473 selected, } x_{k'} = x_{1k'}\text{)}$$

$$\vdots \qquad \vdots$$

$$W_{nk+1} = W_{nk} + 2\mu e_k x_{n,k'} \quad \text{(with switch 479 selected, } x_{k'} = x_{nk'}\text{)}$$

(Equation Series 8)

In this case, the design adjusts the coefficient multipliers of the AFIR filter one at a time and reuses the same LMS adaptation engine for all the coefficient multipliers. For the sign—sign LMS algorithm, a single comparator can be used to obtain the sign of $x_{k'}$. The adapted gradient elements are stored in memory. The internal memory in the adaptation engines is initialized when the LMS engine embarks on the adaptation of another coefficient multiplier. In one example, a finite state machine is used to rotate the adaptation from one coefficient multiplier to another and to perform all of the control and book keeping of the circuit.

According to various embodiments, the adaptation rate of a dual return path distributed AFIR is slower since one gradient element is determined at a time. The slower determination of gradient elements and the resulting coefficient multipliers is fine for convergence and tracking of slowly varying signals. However, if fast acquisition time is needed, the new structure can be scaled up by employing more parallel delay lines and adaptation engines.

In one embodiment, a third output delay line is provided to allow a determination of several gradient elements simultaneously. A third output delay line similar to output delay line 421 is also connected to input delay line 423. In one embodiment, n output delay lines associated with the number of coefficient multipliers are connected to input delay line 423 in order to measure all of the gradient elements simultaneously. It will be appreciated that the delay lines can vary widely in structure and configuration. In one example, selected and a second gradient element is selected before a first switch is selected. After all coefficient multipliers are calculated at 521, the coefficient multipliers are updated in the output delay line at 523. After updating the coefficient multipliers, the output signal typically more closely approximate an expected signal. At 531, it is determined whether or not to continue tuning the coefficient multipliers. In one embodiment, coefficient multipliers or tuned more if the error between the output signal on the expected signal remains above a predetermined level. In other embodiments, coefficient multipliers are continuously tuned.

FIG. 6 shows a listing of various 10 GB per second transponder component interfaces that can be used in optical systems. Rows 601 and 603 show 10 GB standards-based transponders that do not use adaptive equalization. Row 605 shows a standards-based link that achieves somewhat lower cost by incorporating quarter rate receiver optics along with receiver adaptive equalization, according to various embodiments. Row 607 shows quarter rate optical components in both the transmitter and the receiver along with adaptive equalization. In many circumstances, row 607 provides the lowest cost implementation by using the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, embodiments of the present invention may be employed using various transmission media. In another example, a single switch can be used to implement a particular output delay line. In still another example, multiple output delay lines can be provided, each output delay line providing a particular gradient element for calculating coefficient multipliers. Therefore, the scope of the invention should be determined with reference to the appended claims.

What is claimed is:

1. An adaptive equalizer, comprising:
   an input delay line including delay elements, the input delay line configured to receive an input signal and provide intermediate signals, wherein intermediate signals are shifted representations of the input signal;
   a first output delay line including a delay element, the first output delay line configured to receive a first intermediate signal and provide a first gradient element for computing a first coefficient multiplier;
   a second output delay line configured to receive intermediate signals and use the first coefficient multiplier to combine intermediate signals into an equalized output signal.

2. The adaptive equalizer of claim 1, wherein the first output delay line provides the first gradient element for computing the first coefficient multiplier when a first switch associated with the first gradient element is selected.

3. The adaptive equalizer of claim 1, wherein the shifted representations of the input signal are time shifted representations of the input signal.

4. The adaptive equalizer of claim 2, wherein the first output delay line is operable to receive a second intermediate signal and provide a second gradient element for computing a second coefficient multiplier when a second switch associated with the second gradient element is selected.

5. The adaptive equalizer of claim 3, wherein the first output delay line is configured to provide a first gradient element before the second gradient element.

6. The adaptive equalizer of claim 3, wherein the first output delay line is configured to provide a second gradient element before the first gradient element.

7. The adaptive equalizer of claim 2, further comprising:
   a third output delay line operable to receive a second intermediate signals and provide a second gradient element for computing a second coefficient multiplier.

8. The adaptive equalizer of claim 1, wherein the adaptive equalizer is operable to implement least mean square adaptive equalization, signed least mean square equalization, and sign—sign least mean square adaptive equalization.

9. The adaptive equalizer of claim 1 implemented using CMOS.

10. The adaptive equalizer of claim 1, wherein each coefficient multiplier is initially set to equal one.

11. The adaptive equalizer of claim 1, wherein the gradient elements are components of a gradient vector.

12. An equalizer, comprising:
    an input delay line including delay elements, the input delay line configured to receive an input signal and provide intermediate signals, wherein intermediate signals are shifted representations of the input signal;
    a first output delay line including delay elements and switches configured to receive intermediate signals, the first output delay line operable to provide gradient elements for computing coefficient multipliers, wherein a first gradient element is provided for computing a first coefficient multiplier when a first switch associated with the first gradient element is selected;
    a second output delay line including delay elements and coefficient multipliers configured to receive intermediate signals, wherein the plurality of coefficient multipliers are operable to alter intermediate signals using the plurality of coefficient multipliers calculated using the gradient elements provided by the first output delay line.

13. The filter of claim 12, wherein a second gradient element is provided for computing a second coefficient multiplier when a second switch associated with the second gradient element is selected.

14. The filter of claim 13, wherein the coefficient multipliers associated with the variable amplifiers are updated after the plurality of gradient elements are provided.

15. The filter of claim 13, wherein the coefficient multipliers associated with the variable amplifiers are updated after the gradient vector is determined.

16. The filter of claim 13, wherein the filter is implemented using CMOS.

17. An optical switch, comprising:
    an optical receiver;
    adaptive equalization circuitry coupled to the optical receiver, the adaptive equalization circuitry comprising:
       an input delay line including delay elements, the input delay line configured to receive an input signal and provide intermediate signals, wherein intermediate signals are shifted representations of the input signal;
       a first output delay line including delay elements and switches configured to receive intermediate signals, the first output delay line operable to provide gradient elements for computing coefficient multipliers, wherein a first gradient element is provided for computing a first coefficient multiplier when a first switch associated with the first gradient element is selected;
       a second output delay line including delay elements and coefficient multipliers configured to receive intermediate signals, wherein the plurality of coefficient multipliers are operable to alter intermediate signals using the plurality of coefficient multipliers calculated using the gradient elements provided by the first output delay line.

18. The optical switch of claim 17, wherein a second gradient element is provided for computing a second coefficient multiplier when a second switch associated with the second gradient element is selected.

19. The optical switch of claim 18, wherein the coefficient multipliers associated with the variable amplifiers are updated after the plurality of gradient elements are provided.

20. The optical switch of claim 18, wherein the coefficient multipliers associated with the variable amplifiers are updated after the gradient vector is determined.

* * * * *

UNITED STATES PATENT AND TRADEMARK OFFICE
CERTIFICATE OF CORRECTION

PATENT NO. : 7,027,501 B1  Page 1 of 1
APPLICATION NO. : 10/084580
DATED : April 11, 2006
INVENTOR(S) : Tripathi et al.

It is certified that error appears in the above-identified patent and that said Letters Patent is hereby corrected as shown below:

Column 5, line 65, change "$y_k X_{k'}^T W_k$" to -- $y_k = x_{k'}^T W_k$ --.

Signed and Sealed this

Seventh Day of November, 2006

JON W. DUDAS
*Director of the United States Patent and Trademark Office*